(12) United States Patent
Kim

(10) Patent No.: US 8,767,469 B2
(45) Date of Patent: *Jul. 1, 2014

(54) METHOD OF OPERATING NONVOLATILE MEMORY DEVICE

(75) Inventor: Ki Seog Kim, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 218 days.

This patent is subject to a terminal disclaimer.

(21) Appl. No.: 13/363,533

(22) Filed: Feb. 1, 2012

(65) Prior Publication Data
US 2012/0127801 A1    May 24, 2012

Related U.S. Application Data

(63) Continuation-in-part of application No. 12/695,597, filed on Jan. 28, 2010, now Pat. No. 8,130,568.

(30) Foreign Application Priority Data

Jan. 29, 2009  (KR) .................. 10-2009-0006798

(51) Int. Cl.
*G11C 11/34*    (2006.01)

(52) U.S. Cl.
USPC ............. 365/185.18; 365/185.14; 365/185.19

(58) Field of Classification Search
USPC .............. 365/185.16, 185.14, 185.19, 185.18
See application file for complete search history.

(56) References Cited

U.S. PATENT DOCUMENTS 7,082,056 B2 *   7/2006   Chen et al. ............... 365/185.2

* cited by examiner

*Primary Examiner* — Son Dinh
(74) *Attorney, Agent, or Firm* — IP & T Group LLP

(57) ABSTRACT

A method of operating a nonvolatile memory device includes performing a LSB program operation on memory cells coupled to a selected word line and a word line adjacent to the selected word line; performing a first MSB program operation so that the threshold voltages of the memory cells coupled to the selected word line reach temporary voltages lower than first target voltages; performing a second MSB program operation so that the threshold voltages of the memory cells coupled to the word line adjacent to the selected word line are higher than second target voltages; and performing a third MSB program operation so that the threshold voltages of the memory cells coupled to the selected word line are higher than the first target voltages.

12 Claims, 7 Drawing Sheets

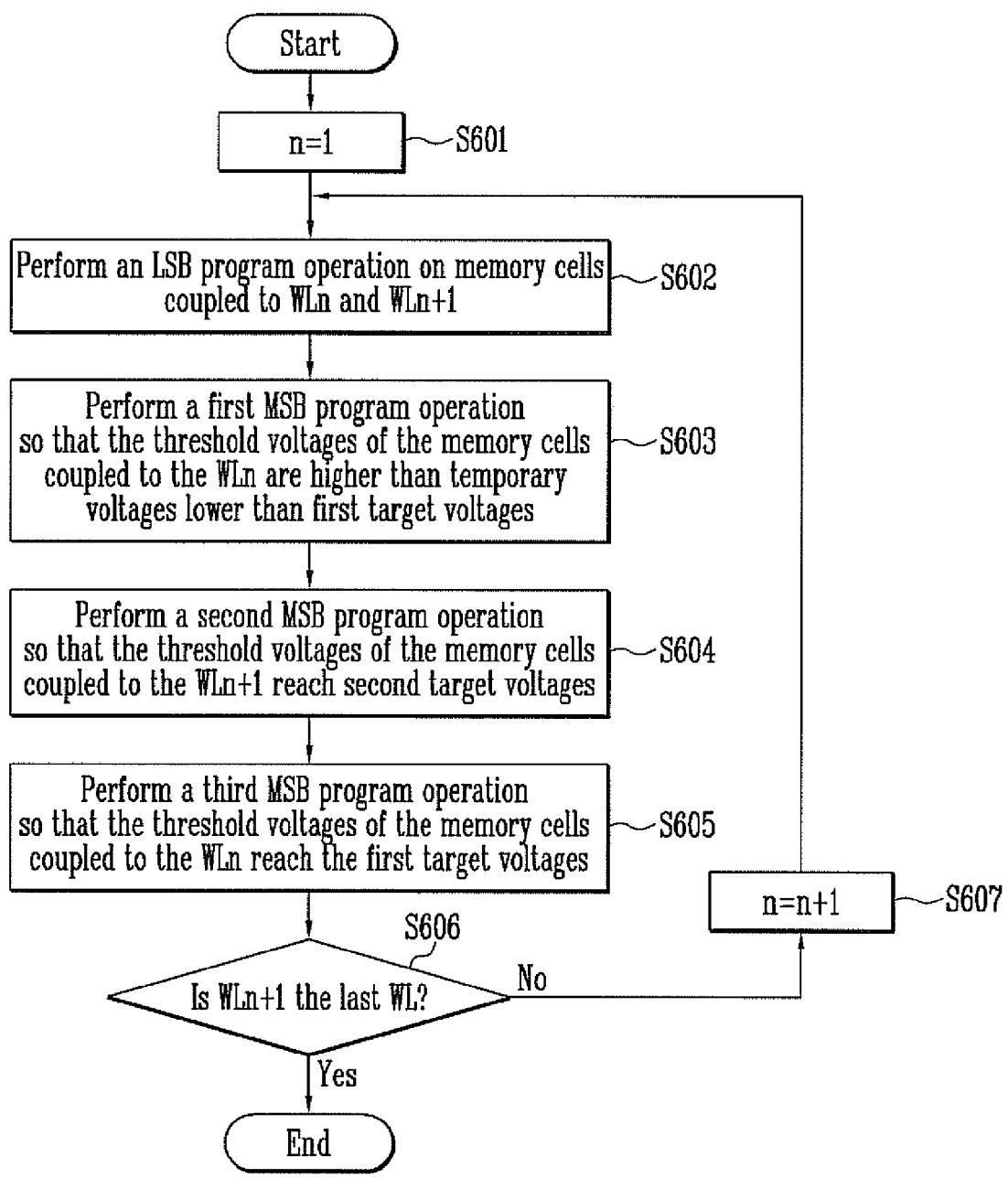

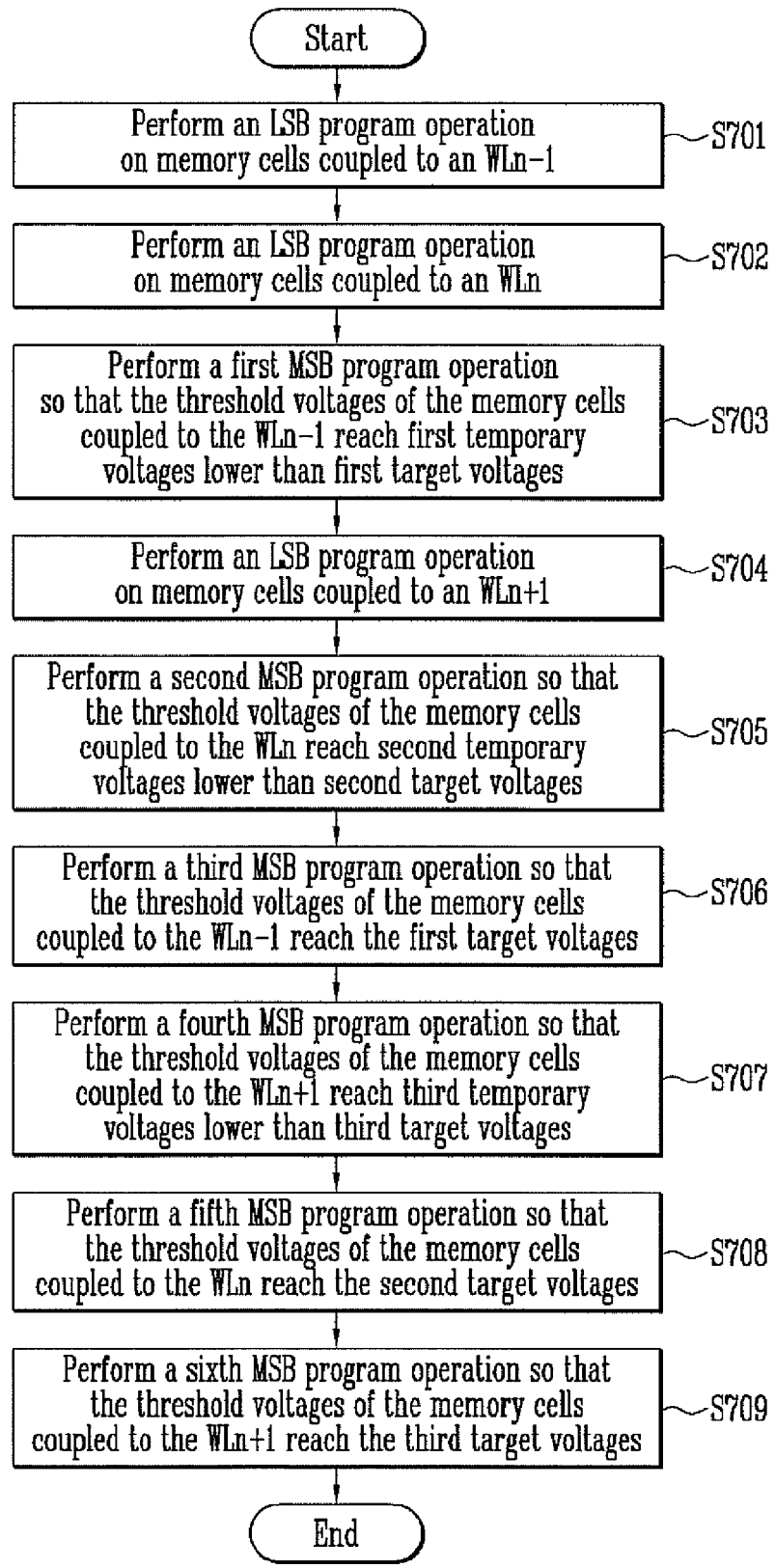

METHOD OF OPERATING NONVOLATILE MEMORY DEVICE

CROSS-REFERENCE TO RELATED APPLICATION

This application is a continuation-in-part of U.S. patent application Ser. No. 12/695,597 filed on Jan. 28, 2010 now U.S. Pat. No. 8,130,568, which claims priority from Korean patent application number 10-2009-0006798 filed on Jan. 29, 2009. The disclosure of each of the foregoing applications is incorporated herein by reference in its entirety.

BACKGROUND

Exemplary embodiments relate to a method of operating a nonvolatile memory device and, more particularly, to a method of programming a nonvolatile memory device which is capable of preventing an increase in the distribution of threshold voltages.

A nonvolatile memory device includes a memory cell array configured to store data. The memory cell array includes a number of cell strings. FIG. 1 is a diagram illustrating interferences occurring when a program operation in a nonvolatile memory device is performed.

Referring to FIG. 1, the memory cell array of the nonvolatile memory device includes a number of cell strings STe and STo. The cell strings STe or STo include a drain select transistor DST, a source select transistor SST, and a number of memory cells F0 to Fn coupled in series between the drain select transistor DST and the source select transistor SST. The drain of the drain select transistor DST is coupled to a bit line BLe or BLo, and the source of the source select transistor SST is coupled to a global source line CSL. The gates of the drain select transistors DSTs, included in different cell strings STe and STo, are coupled together to form a drain selection line DSL. Likewise, the gates of the source select transistors SSTs, included in different cell strings STe and STo, are coupled together to form a source selection line SSL. Furthermore, the gates of the memory cells F0 to Fn, included in different cell strings STe and STo, are coupled together to form word lines WL0 to WLn, respectively.

A program operation on the memory cells of the nonvolatile memory device may be performed in various manners. For example, because the distance between the cell strings is very narrow, an even cell string STe and an odd cell string STo, classified according to their arrangement, are not selected at the same time. Furthermore, after a program operation is performed on a first memory cell 1 selected by the odd cell string STo and the first word line WL0, a second program operation may be performed on second memory cells 2 coupled to the first word line WL0 and the even cell strings STe. Next, a third program operation may performed on a third memory cell 3 selected by the odd cell string STo and the second word line WL1, and a fourth program operation may be performed on fourth memory cells 4 coupled to the second word line WL1 and the even cell strings STe.

Meanwhile, the first memory cell 1 that is first programmed is subject to interference X and Y while the subsequent program operations are performed on the second and third memory cells 2 and 3. Although the first memory cell 1 may be subject to interference while the program operation is performed on the fourth memory cells 4, the interference resulting from the program operations for the second and third memory cells 2 and 3 is the greatest because of the shorter distance.

FIG. 2 is a diagram illustrating a shift in a threshold voltage resulting from interference when a program operation is performed.

Referring to FIGS. 1 and 2, assuming that a distribution of threshold voltages (i.e., state 'A') is a target threshold voltage distribution in which interference does not occur, a distribution of the threshold voltage can be gradually widened because of interference, as indicated by X and Y.

BRIEF SUMMARY

In an embodiment of the present disclosure, a program operation is performed on a first memory cell using a temporary target voltage less than a target voltage with consideration taken of interferences, which may occur when a program operation is performed on adjacent memory cells. After a program operation is performed on a second memory cell adjacent to the first memory cell, a reprogram operation is performed on the first memory cell. Accordingly, an increase of the threshold voltage distribution resulting from interference can be prevented.

A method of operating a nonvolatile memory device according to an embodiment of this disclosure includes performing a LSB program operation on memory cells coupled to a selected word line and a word line adjacent to the selected word line; performing a first MSB program operation so that the threshold voltages of the memory cells coupled to the selected word line reach temporary voltages lower than first target voltages; performing a second MSB program operation so that the threshold voltages of the memory cells coupled to the word line adjacent to the selected word line are higher than second target voltages; and performing a third MSB program operation so that the threshold voltages of the memory cells coupled to the selected word line are higher than the first target voltages.

A method of operating a nonvolatile memory device according to another embodiment of this disclosure includes performing a first MSB program operation so that the threshold voltages of memory cells coupled to an $(n-1)^{th}$ word line reach first temporary voltages lower than first target voltages; performing a second MSB program operation so that the threshold voltages of memory cells coupled to an $n^{th}$ word line adjacent to the $(n-1)^{th}$ word line reach second temporary voltages lower than second target voltages; performing a third MSB program operation so that the threshold voltages of the memory cells coupled to the $(n-1)^{th}$ word line are higher than the first target voltages; performing a third MSB program operation so that the threshold voltages of memory cells coupled to an $(n+1)^{th}$ word line adjacent to the $n^{th}$ word line reach third temporary voltages lower than third target voltages; performing a fourth MSB program operation so that the threshold voltages of the memory cells coupled to the $n^{th}$ word line are higher than the second target voltages; and performing a fifth MSB program operation so that the threshold voltages of the memory cells coupled to the $(n+1)^{th}$ word line are higher than the third target voltages.

BRIEF DESCRIPTION OF THE DRAWINGS

FIG. 6 is a detailed flowchart illustrating the program method of FIG. 5;

FIG. 7 is a flowchart illustrating a program method of a nonvolatile memory device according to yet another embodiment of this disclosure.

DESCRIPTION OF EMBODIMENTS

Hereinafter, exemplary embodiments of the present disclosure will be described in detail with reference to the accompanying drawings. The figures are provided to allow those having ordinary skill in the art to understand the scope of the embodiment of the disclosure.

Figure 3:
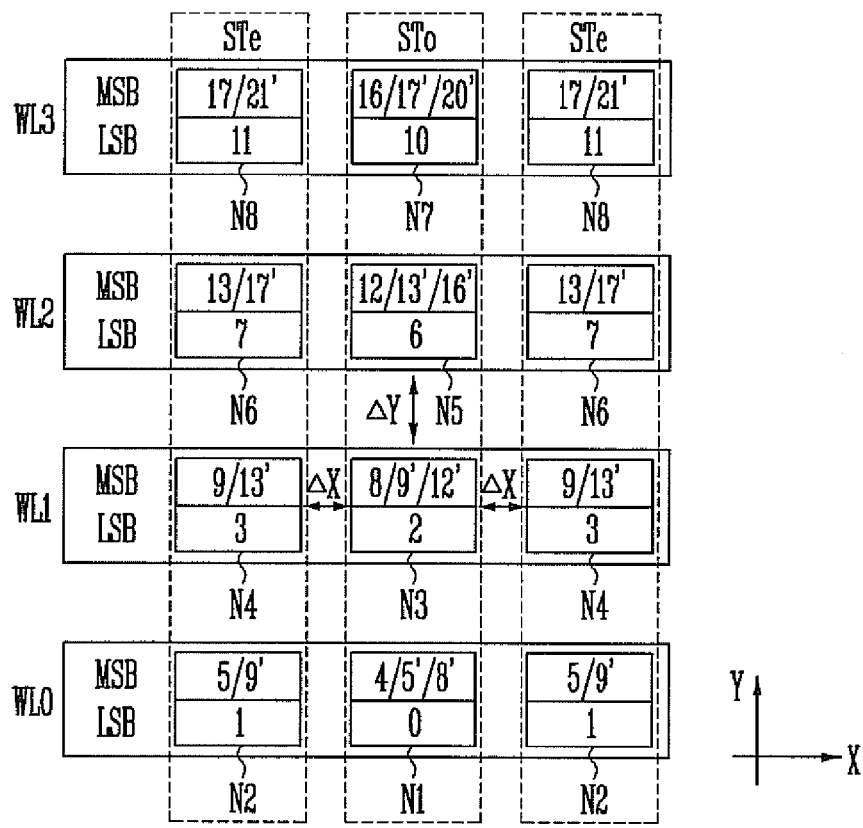
FIG. 3 is a diagram illustrating a program method of a nonvolatile memory device according to an embodiment of this disclosure.

FIG. 3 is a diagram illustrating a program method of a nonvolatile memory device according to an embodiment of this disclosure.

Figure 1:
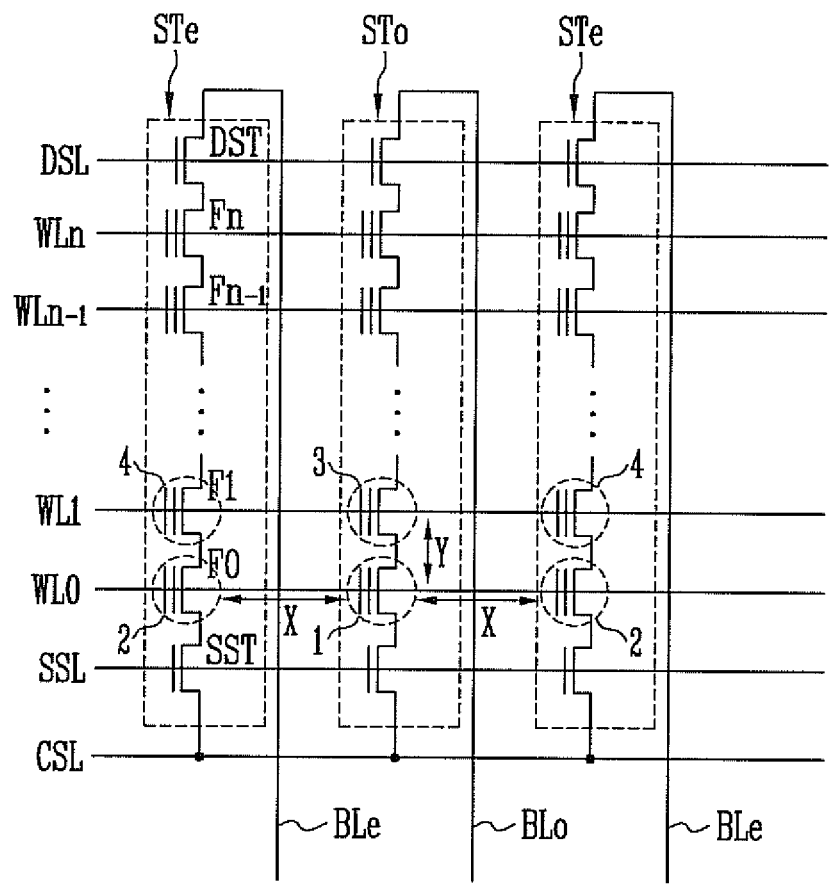
FIG. 1 is a diagram illustrating interferences occurring when an exemplary program operation in a nonvolatile memory device is performed.
Figure 2:
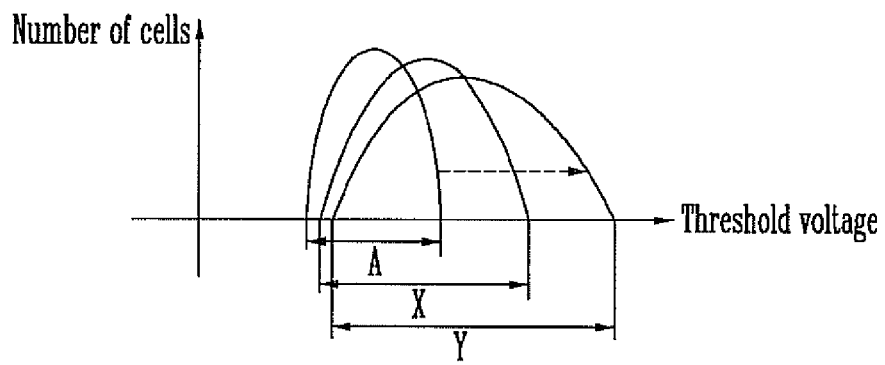
FIG. 2 is a diagram illustrating a shift in the threshold voltage resulting from interference when an exemplary program operation is performed.

More specifically, FIG. 3 shows a sequence of programming a memory cell array, comprising three cell strings STe and STo and four word lines WL0 to WL3. In other words, FIG. 3 shows a sequence of programming 12 memory cells. Although the method of programming illustrated in FIG. 3 may be applied to a memory cell array with higher than 12 memory cells, the following description is provided with reference to only 12 memory cells for the sake of convenience. Referring to FIG. 3, the memory cell array includes a number of cell strings STe and STo. The cell string STe or STo include a drain select transistor (refer to DST of FIG. 1), a source select transistor (refer to SST of FIG. 1), and a number of memory cells N2, N4, N6, and N8 (in the cell string STe) or N1, N3, N5, and N7 (in the cell string STo) coupled in series between the drain select transistor and the source select transistor.

Referring to FIG. 3, program operations are performed in order according to the numerals written in the memory cells. Numbers followed by an apostrophe indicate supplemental operations, explained in more detail below.

A LSB program operation is performed using a voltage level less than that of a Most Significant Bit (hereinafter referred to as an MSB) program operation. Further, while subsequent programming operations create an interference that has a significant influence on MSB program operations, subsequent programming operations barely influence Least Significant Bit (hereinafter referred to as a LSB) program operations. Referring to FIG. 3, first, a LSB program operation 0 is performed on a first memory cell N1 coupled to the odd cell string STo and the first word line WL0. A LSB program operation 1 is performed on second memory cells N2 coupled to the first word line WL0 and the even cell strings STe. A LSB program operation 2 is performed on a third memory cell N3 coupled to the odd cell string STo and the second word line WL1. Next, a LSB program operation 3 is performed on fourth memory cells N4 coupled to the second word line WL1 and the even cell strings STe. A MSB program operation 4 is performed on the first memory cell N1 on which the LSB program operation 0 was performed.

Here, the MSB program operation 4 is performed using a temporary target voltage less than a target voltage with consideration taken of interferences ΔX and ΔY resulting from program operations for adjacent memory cells. The temporary target voltage preferably is set to be lower than the target voltage by the amount of a shift in the threshold voltage which is increased because of the interferences ΔX and ΔY.

Next, an MSB program operation 5 is performed on the second memory cells N2 adjacent to the first memory cell N1 in the X-axis direction. Here, the MSB program operation 5 is performed using a temporary target voltage less than a target voltage by taking the interferences ΔX and ΔY resulting from program operations for adjacent memory cells into consideration. Here, the distribution of the threshold voltage of the first memory cell N1 on which the MSB program operation 4 was performed may be widened because of interferences ΔX resulting from the MSB program operation 5. To narrow the distribution of the threshold voltage of the first memory cell N1, an MSB program operation 5' is performed on the first memory cell N1 using a reference voltage which is higher than the temporary target voltage, but less than the target voltage.

Next, a LSB program operation 6 is performed on a fifth memory cell N5 coupled to the odd cell string STo and the third word line WL2. A LSB program operation 7 is then performed on sixth memory cells N6 coupled to the even cell strings STe and the third word line WL2. A MSB program operation 8 is performed on the third memory cell N3 on which the LSB program operation 2 was performed. The MSB program operation 8 is performed using a temporary target voltage less than a target voltage by taking the interferences ΔX and ΔY resulting from program operations on adjacent memory cells into consideration. Here, the distribution of the threshold voltage of the first memory cell N1 can be widened because of interference ΔY in the Y-axis direction resulting from the MSB program operation 8. To narrow the distribution, an MSB program operation 8' is performed on the first memory cell N1 using a target voltage, thereby completing the program operation on the first memory cell N1.

Next, an MSB program operation 9 is performed on the fourth memory cells N4 coupled to the even cell strings STe and the second word line. The MSB program operation 9 is performed using a temporary target voltage less than the target voltage by taking the interferences ΔX and ΔY resulting from program operations on adjacent memory cells into consideration. Here, the distributions of the threshold voltages of the second memory cells N2, adjacent to the fourth memory cells N4 in the Y-axis direction, and the distribution of the threshold voltage of the third memory cell N3, adjacent to the fourth memory cells N4 in the X-axis direction, can be widened because of interferences XX and ΔY resulting from the MSB program operation 9. To narrow the distributions, an MSB program operation 9' is performed on the third memory cell N3 and the second memory cells N2 using a reference voltage which is higher than the temporary target voltage, but less than the target voltage. In the case in which the second memory cell N2 is included in the first or last cell string of the memory cell array, the MSB program operation 9' preferably is performed using the target voltage.

Next, a LSB program operation 10 is performed on a seventh memory cell N7 coupled to the odd cell string STo and the fourth word line WL3. A LSB program operation 11 is then performed on eighth memory cells N8 coupled to the even cell strings STe and the fourth word line WL3. Next, an MSB program operation 12 is performed on the fifth memory cell N5 coupled to the odd cell string STo and the third word line WL2. The MSB program operation 12 is performed using a temporary target voltage less than a target voltage by taking the interference ΔX and ΔY resulting from program operations for adjacent memory cells into consideration. Here, the distribution of the threshold voltage of the third memory cell N3 on which the MSB program operation 8 was performed and which was influenced by the interference resulting from the MSB program operation 9 for the fourth memory cells N4 can be increased because of re-interference ΔY resulting from the MSB program operation 12. To narrow the distribution of the threshold voltage of the third memory cell N3, an MSB program operation 12' is performed on the third memory cell N3 using the target voltage, thereby completing the program operation on the third memory cell N3.

Meanwhile, most of the memory cells are subject to interference twice resulting from program operations on adjacent memory cells in the X- and Y-axis directions, except for memory cells included in the first and last cell strings of the memory cell array, which are subject to interference once resulting from program operations on memory cells adjacent in the Y-axis direction. Accordingly, MSB program operations performed on respective memory cells for the first time are preferably performed by setting different temporary target voltages.

A shift in the threshold voltage according to the above-described program operations is described in more detail below.

Figure 4:
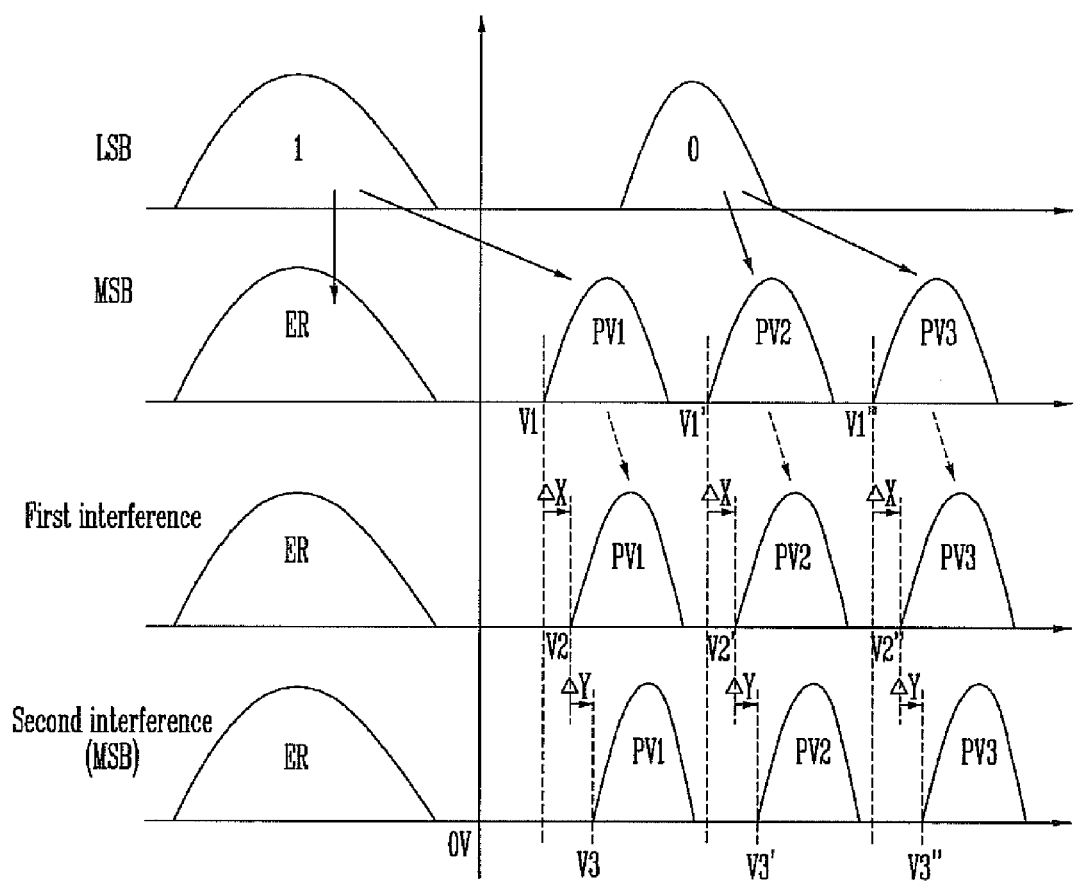
FIG. 4 is a diagram illustrating threshold voltages during a program operation according to an embodiment of this disclosure.

FIG. 4 is a diagram illustrating threshold voltages during a program operation according to an embodiment of this disclosure.

Referring to FIG. 4, in the case in which a program operation is performed using an MLC method, a program state can be classified into a number of periods. For example, the program state can be classified into one erase period ER, a first program period PV1, a second program period PV2, and a third program period PV3.

For convenience of description, a first memory cell to be programmed is described as an example.

The threshold voltage of the first memory cell is raised by performing a LSB program operation on the first memory cell, such that a distribution of the threshold voltage of the first memory cell, belonging to the erase period ER, becomes a program state.

A LSB program operation is then performed on memory cells to be programmed with threshold voltages, belonging to the second program period PV2 or the third program period PV3, such that a distribution of the threshold voltages of the memory cells, belonging to the erase period ER, becomes a program state.

Next, a first MSB program operation MSB1 is performed on the first memory cell. The first MSB program operation MSB1 preferably is performed using a first reference voltage (any one of V1, V1', and V1") (i.e., a temporary target voltage) less than a third reference voltage (any one of V3, V3', and V3") (i.e., a target voltage) by taking interferences resulting from program operations on adjacent memory cells into consideration. That is, in the case in which the first memory cell is subject to interference twice resulting from program operations on adjacent memory cells, the first reference voltage (any one of V1, V1', and V1") can be set with consideration given to the fact that a distribution of the threshold voltage of the first memory cell may be increased as a result of interferences. For example, the first reference voltage (any one of V1, V1', and V1") can be set to have a voltage level less than that of the third reference voltage (any one of V3, V3', and V3") by the amount of a shift in the threshold voltage caused by interferences in the X and Y directions (ΔX and ΔY).

Next, an MSB program operation is performed on second memory cells adjacent to the first memory cell in the X-axis direction. In this case, the distribution of the threshold voltage of the first memory cell can be widened (by ΔX) because of interference resulting from the MSB program operation for the second memory cells. To narrow the threshold voltage distribution of the first memory cell, a second MSB program operation MSB2 is performed on the first memory cell using a second reference voltage (any one of V2, V2', and V2"). The second reference voltage (any one of V2, V2', and V2") is preferably set to have a voltage level less than the third reference voltage (any one of V3, V3', and V3") at least as much as the amount of a shift (ΔY) in the distribution of the threshold voltage with consideration taken of the influence of interferences that may occur when a program operation is performed on a third memory cell adjacent to the first memory cell in the Y-axis direction. That is, the second reference voltage (any one of V2, V2', and V2") is set to be higher than the first reference voltage (any one of V1, V1', and V1"), but less than the third reference voltage (any one of V3, V3', and V3").

Next, an MSB program operation is performed on the third memory cell adjacent to the first memory cell in the Y-axis direction. At this time, the threshold voltage distribution of the first memory cell can be widened (by ΔY) because of interference resulting from the MSB program operation. To narrow the threshold voltage distribution of the first memory cell, a third MSB program operation MSB3 is performed on the first memory cell using the third reference voltage (any one of V3, V3', and V3") (i.e., the target voltage), thereby completing the program operation on the first memory cell.

Figure 5:
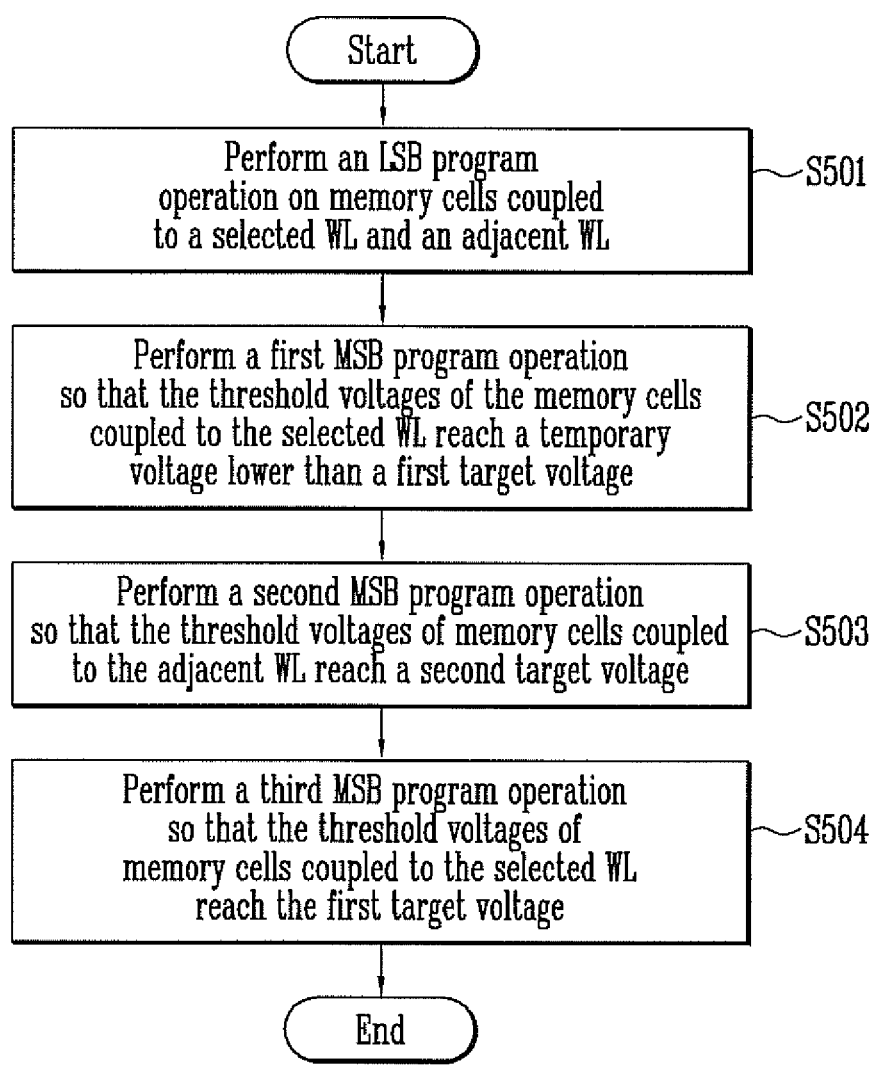
FIG. 5 is a flowchart illustrating a program method of a nonvolatile memory device according to another embodiment of this disclosure.

FIG. 5 is a flowchart illustrating a program method of a nonvolatile memory device according to another embodiment of this disclosure.

Referring to FIG. 5, if memory cells coupled to two adjacent word lines are to be programmed, memory cells coupled to a selected word line are programmed with voltage lower than target voltages, memory cells coupled to a word line adjacent to the selected word line are programmed, and the memory cells coupled to the selected word line are then programmed with the target voltages. This is described in detail below.

Least Significant Bit (LSB) Program Operation (S501)

Figure 8A:
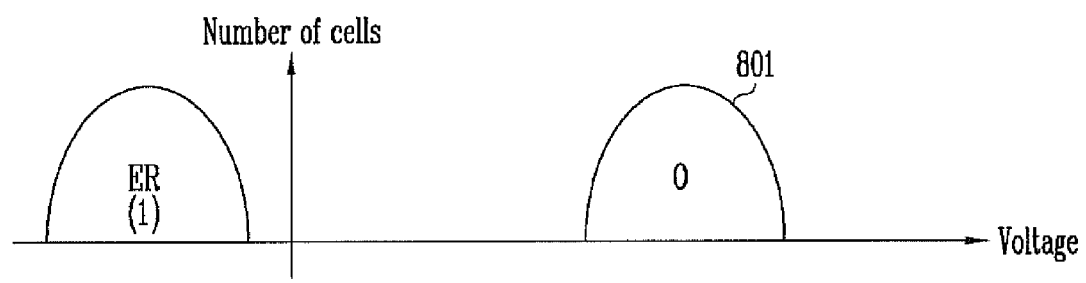
FIGS. 8A to 8D are diagrams illustrating a distribution of threshold voltages according to the program methods of FIGS. 5 and 6.

A LSB program operation is performed on memory cells coupled to the selected word line WLn and a word line WLn−1 or WLn+1 adjacent to the selected word line WLn (refer to 801 of FIG. 8A). The LSB program operation may be performed using an incremental step pulse program (ISPP) method of gradually raising a program voltage. The LSB program operation may be performed in a sequence of performing a first LSB program operation on the memory cells coupled to the selected word line WLn and performing a second LSB program operation on the memory cells coupled to the adjacent word line WLn−1 or WLn+1. In some embodiments, the sequence of performing the first and the second LSB program operations may be changed. If the first LSB program operation is first performed on the memory cells coupled to the selected word line WLn, the threshold voltages of target LSB cells, from among the memory cells coupled to the selected word line WLn and programmed with an erase state ER (1), are raised (0). For example, the target LSB cells may include memory cells to be programmed with a second state PV2 higher than a first state PV1 and memory cells to be programmed with a third state PV3 higher than the second state PV2. Next, the threshold voltages of target LSB cells, from among memory cells (1) coupled to a second word line WL2 and programmed with an erase state, are raised (0).

First MSB Program Operation (S502)

A first MSB program operation is performed so that the threshold voltages of the memory cells coupled to the selected word line WLn are higher than temporary voltages (Va, Va', and Va" of FIG. 8A). The temporary voltages Va, Va', and Va" may be set with consideration taken of interference occurring when program operations are performed on the memory cells coupled to the adjacent word line WLn−1 or WLn+1. That is, the temporary voltages Va, Va', and Va" are set such that the target voltages of the selected memory cells are lower than first target voltages (refer to $V_T$, $V_T'$, and $V_T''$ of FIG. 8D) (i.e., the final target voltages) by a shift in the threshold voltage resulting from the interference occurring during the program operation on the adjacent memory cells. The first MSB program operation may be performed using an incremental step pulse program (ISPP) method of gradually raising a program voltage. Accordingly, the first MSB program operation is repeatedly performed while raising the program voltage by a first step voltage until the threshold voltages of the memory cells coupled to the selected word line WLn are higher than temporary voltages (refer to 802 of FIG. 8B).

Second MSB Program Operation (S503)

A second MSB program operation is performed so that the threshold voltages of the memory cells coupled to the adjacent word line WLn−1 or WLn+1 coupled to the selected word line WLn are higher than second target voltages. The second target voltages are equal to the final threshold voltages of the memory cells coupled to the adjacent word line WLn−1 or WLn+1. The second MSB program operation may be performed using an incremental step pulse program (ISPP) method of gradually raising a program voltage. Accordingly, the second MSB program operation is repeatedly performed while raising the program voltage until the threshold voltages of the memory cells coupled to the adjacent word line WLn−1 or WLn+1 are higher than the second target voltages. During the second MSB program operation, the threshold voltages of the memory cells coupled to the selected word line WLn may rise owing to interference (refer to 803 of FIG. 8C).

Third MSB Program Operation (S503)

Figure 8B:
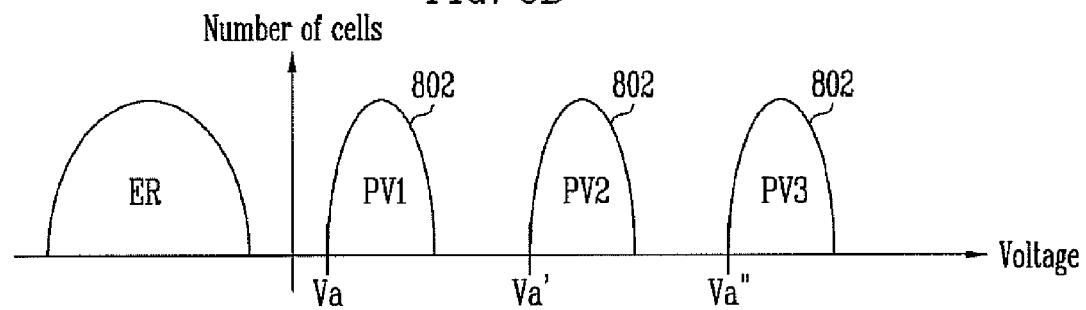
Figure 8C:
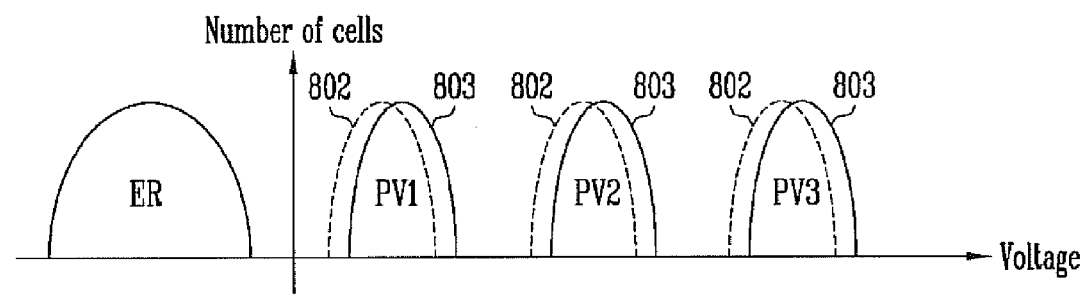
Figure 8D:
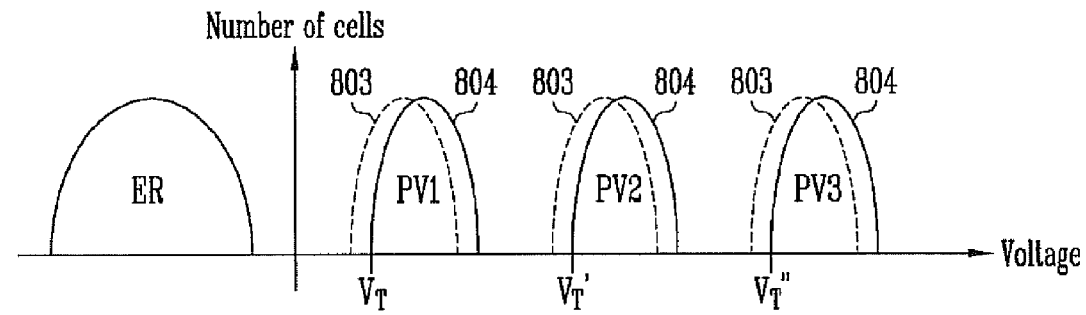

A third MSB program operation is performed so that the threshold voltages of the memory cells coupled to the selected word line WLn are higher than the first target voltages ($V_T$, $V_T'$, and $V_T''$ of FIG. 8D). The third MSB program operation may be performed using an incremental step pulse program (ISPP) method of gradually raising a program voltage. Accordingly, the third MSB program operation is repeatedly performed while raising the program voltage by a second step voltage until the threshold voltages of the memory cells coupled to the selected word line WLn are higher than the first target voltages $V_T$, $V_T'$, and $V_T''$ (refer to 804 of FIG. 5D). The third MSB program operation is performed to raise the threshold voltages of memory cells for which the first MSB program operation has been completed to the final target voltages. Thus, in order to suppress a distribution of the threshold voltages from rising, the program voltage may be raised by the second step voltage lower than the first step voltage used in the first MSB program operation.

As described above, after the program operation for the memory cells coupled to the adjacent word line is completed, the memory cells coupled to the selected word line are programmed with threshold voltages higher than the final target voltages. Accordingly, a shift in the threshold voltage due to interference occurring when the program operations are performed on the memory cells coupled to the adjacent word line can be offset.

FIG. 6 is a detailed flowchart illustrating the program method of FIG. 5.

Referring to FIG. 6, after 'n' is reset to 1 at step S601, a program operation is performed on a selected memory cell block.

First MSB Program Operation (S602)

A LSB program operation is performed on memory cells coupled to an $n^{th}$ word line WLn and to an $(n+1)^{th}$ word line WLn+1 adjacent to the $n^{th}$ word line WLn at step S602. The LSB program operation may be performed using an incremental step pulse program (ISPP) method of gradually raising a program voltage. The LSB program operation may be performed in a sequence of completing a first LSB program operation for the memory cells coupled to the $n^{th}$ word line WLn and then completing a second LSB program operation for the memory cells coupled to the $(n+1)^{th}$ word line WLn+1. The sequence of performing the first and the second LSB program operations may be changed. If the first LSB program operation is first performed on the memory cells coupled to the $n^{th}$ word line WLn, the threshold voltages of target LSB cells, from among the memory cells coupled to the $n^{th}$ word line WLn and programmed with an erase state ER(1), are raised (0). For example, the target LSB cells may include memory cells to be programmed with the second state PV2 higher than the first state PV1 and memory cells to be programmed with the third state PV3 higher than the second state PV2. Next, the threshold voltages of the target LSB cells, from among the memory cells coupled to the $(n+1)^{th}$ word line WLn+1 and programmed with the erase state ER(1), are raised (0).

First MSB Program Operation (S603)

A first MSB program operation is performed so that the threshold voltages of the memory cells coupled to the $n^{th}$ word line WLn are higher than the temporary voltages (refer to Va, Va', and Va" of FIG. 8B). The temporary voltages Va, Va', and Va" may be set with consideration taken of interference occurring when program operations are performed on the memory cells coupled to the $(n+1)^{th}$ word line WLn+1 adjacent to the $n^{th}$ word line WLn. In other words, the temporary voltages Va, Va', and Va" may be set to be lower than first target voltages ($V_T$, $V_T'$, and $V_T''$ of FIG. 8D) by a shift in the threshold voltage which rises owing to interference when the program operations are performed on adjacent memory cells. The first MSB program operation may be performed using an incremental step pulse program (ISPP) method of gradually raising a program voltage. Accordingly, the first MSB program operation is repeatedly performed while raising the program voltage by a first step voltage until the threshold voltages of the memory cells coupled to the $n^{th}$ word line WLn are higher than the temporary voltages (refer to 802 of FIG. 8B).

Second MSB Program Operation (S604)

A second MSB program operation is performed so that the threshold voltages of the memory cells coupled to the $(n+1)^{th}$ word line WLn+1 adjacent to the $n^{th}$ word line WLn are higher than second target voltages. The second target voltages are equal to the final target threshold voltages of the memory cells coupled to the $(n+1)^{th}$ word line WLn+1. The second MSB program operation may be performed using an incremental step pulse program (ISPP) method of gradually raising a program voltage. Accordingly, the second MSB program operation is repeatedly performed while raising the program voltage until the threshold voltages of the memory cells coupled to the $(n+1)^{th}$ word line WLn+1 are higher than the second target voltages. During the second MSB program operation, the threshold voltages of the memory cells coupled to the $n^{th}$ word line WLn adjacent to the $(n+1)^{th}$ word line WLn+1 may rise owing to interference (refer to 803 of FIG. 8C).

Third MSB Program Operation (S604)

A third MSB program operation is performed so that the threshold voltages of the memory cells coupled to the $n^{th}$ word line WLn are higher than the first target voltages ($V_T$, $V_T'$, and $V_T''$ of FIG. 8D). The third MSB program operation may be performed using an incremental step pulse program (ISPP) method of gradually raising a program voltage. Accordingly, the third MSB program operation is repeatedly performed while raising the program voltage by a second step voltage until the threshold voltages of the memory cells coupled to the $n^{th}$ word line WLn are higher than the first target voltages $V_T$, $V_T'$, and $V_T''$ (refer to 804 of FIG. 8D). The third MSB program operation is performed to raise the threshold voltages of memory cells on which the first MSB program operation has been completed to the final target voltages. Accordingly, in order to suppress a distribution of the threshold voltages from rising, the program voltage may be raised by the second step voltage lower than the first step voltage used in the first MSB program operation.

Last Word Line (S606)

It is determine whether the $(n+1)^{th}$ word line WLn+1 is the last word line of the selected memory cell block. If, as a result of the determination, the $(n+1)^{th}$ word line WLn+1 is the last word line, the program operation of the selected memory cell block is finished. If, as a result of the determination, the $(n+1)^{th}$ word line WLn+1 is not the last word line, a next word line is selected (n=n+1) at step S607, and the steps S602 to S607 are repeated until the program operations are completed up to the last word line.

FIG. 7 is a flowchart illustrating a program method of a nonvolatile memory device according to yet another embodiment of this disclosure.

A sequence of program operations for memory cells coupled to three or more word lines is described below. A LSB program operation is performed on memory cells coupled to an $(n-1)^{th}$ word line WLn-1 at step S701.

A LSB program operation is performed on memory cells coupled to an $n^{th}$ word line WLn adjacent to the $(n-1)^{th}$ word line WLn-1 at step S702. The LSB program operation may be performed using an incremental step pulse program (ISPP) method of gradually raising a program voltage.

A first MSB program operation is performed so that the threshold voltages of the memory cells coupled to the $(n-1)^{th}$ word line WLn-1 reach first temporary voltages lower than first target voltages (i.e., the final target voltages) at step S703. The first target voltages refer to the final target voltages of the memory cells coupled to the $(n-1)^{th}$ word line WLn-1. The first temporary voltages may be set as voltages which are lower than the first target voltages by a shift in the threshold voltage due to interference occurring when the MSB program operations are performed on adjacent memory cells.

The LSB program operation is performed on memory cells coupled to an $(n+1)^{th}$ word line WLn+1 at step S704.

A second MSB program operation is performed so that the threshold voltages of the memory cells coupled to the $n^{th}$ word line WLn reach second temporary voltages lower than second target voltages (i.e., the final target voltages) at step S705. The second target voltages refer to the final target voltages of the memory cells coupled to the $n^{th}$ word line WLn. The second temporary voltage may be set as voltages which are lower than the second target voltages by a shift in the threshold voltage due to interference when the MSB program operations are performed on adjacent memory cells.

Next, a third MSB program operation is performed so that the threshold voltages of the memory cells coupled to the $(n-1)^{th}$ word line WLn-1 reach the first target voltages at step S706, thereby completing the program operations for the memory cells coupled to the $(n-1)^{th}$ word line WLn-1. The third MSB program operation is performed on memory cells having threshold voltages approached the first target voltages owing to the first MSB program operation. For this reason, a step voltage used in the third MSB program operation may be set to be lower than a step voltage used in the first MSB program operation in order to suppress an increase in the distribution of the threshold voltages.

A fourth MSB program operation is performed so that the threshold voltages of the memory cells coupled to the $(n+1)^{th}$ word line WLn+1 reach third temporary voltages lower than third target voltages at step S707. The third target voltages refer to the final target voltages of the memory cells coupled to the $(n+1)^{th}$ word line WLn+1. The third temporary voltages may be set as voltages which are lower than the third target voltages by a shift in the threshold voltage due to interference occurring when MSB program operations are performed on adjacent memory cells.

A fifth MSB program operation is performed so that the threshold voltages of the memory cells coupled to the $n^{th}$ word line WLn reach the second target voltages, thereby completing the program operations for the memory cells coupled to the $n^{th}$ word line WLn at step S708. The fifth MSB program operation is performed on memory cells having threshold voltages approached the second target voltages owing to the second MSB program operation. For this reason, a step voltage used in the fifth MSB program operation may be set to be lower than a step voltage used in the second MSB program operation in order to suppress a distribution of the threshold voltages from rising.

Next, a sixth MSB program operation is performed so that the threshold voltages of the memory cells coupled to the $(n+1)^{th}$ word line WLn+1 reach the third target voltages at step S709, thereby completing the program operations for the memory cells coupled to the $(n+1)^{th}$ word line WLn+1. The sixth MSB program operation is performed on memory cells having threshold voltages approached the third target voltages owing to the third MSB program operation. For this reason, a step voltage used in the sixth MSB program operation may be set to be lower than the step voltage used in the third MSB program operation in order to suppress a distribution of the threshold voltages from rising.

As described above, a program operation is performed on selected memory cells using a temporary target voltage less than a target voltage. If a distribution of the threshold voltages of the memory cells is affected by interference, a re-program operation is performed on the memory cells, with a raised temporary target voltage in order to narrow the threshold voltage distribution. As described above, since an interference phenomenon is employed, the degree of integration of nonvolatile memory devices can be increased, and a margin between threshold voltage distributions of program periods can be secured. Accordingly, reliability of the nonvolatile memory device can be improved.

Furthermore, program operations are performed by taking advantage of interferences occurring when program operations are performed on adjacent memory cells. Thus, additional manufacturing processes and circuits are not required. Accordingly, the degree of integration of nonvolatile memory devices can be increased and a distribution of the threshold voltage of a program state can be narrowed. Consequently, reliability of the nonvolatile memory device can be improved.

What is claimed is:

1. A method of operating a nonvolatile memory device, comprising:

performing a Least Significant Bit (hereinafter referred to as a LSB) program operation on memory cells coupled to a selected word line and a word line adjacent to the selected word line;

performing a first Most Significant Bit (hereinafter referred to as an MSB) program operation so that threshold voltages of the memory cells coupled to the selected word line reach temporary voltages lower than first target voltages;

performing a second MSB program operation so that threshold voltages of the memory cells coupled to the word line adjacent to the selected word line are higher than second target voltages; and performing a third MSB program operation so that the threshold voltages of the memory cells coupled to the selected word line are higher than the first target voltages.

2. The method of claim 1, wherein the LSB program operation comprises:

a first LSB program operation for raising the threshold voltages of the memory cells coupled to the selected word line; and a second LSB program operation for raising the threshold voltages of the memory cells coupled to the word line adjacent to the selected word line.

3. The method of claim 1, wherein the first to third MSB program operations are performed using an incremental step pulse program (ISPP) method of raising a program voltage by a step voltage.

4. The method of claim 3, wherein the step voltage of the third MSB program operation is lower than the step voltage of the first MSB program operation.

5. The method of claim 1, wherein the temporary voltages are set to be lower than the first target voltages by a shift in the threshold voltage due to interference occurring when the second MSB program operation is performed.

6. A method of operating a nonvolatile memory device, comprising:

performing a first MSB program operation so that threshold voltages of memory cells coupled to an $(n-1)^{th}$ word line reach first temporary voltages lower than first target voltages;

performing a second MSB program operation so that threshold voltages of memory cells coupled to an $n^{th}$ word line adjacent to the $(n-1)^{th}$ word line reach second temporary voltages lower than second target voltages;

performing a third MSB program operation so that the threshold voltages of the memory cells coupled to the $(n-1)^{th}$ word line are higher than the first target voltages;

performing a third MSB program operation so that threshold voltages of memory cells coupled to an $(n+1)^{th}$ word line adjacent to the $n^{th}$ word line reach third temporary voltages lower than third target voltages;

performing a fourth MSB program operation so that the threshold voltages of the memory cells coupled to the $n^{th}$ word line are higher than the second target voltages; and performing a fifth MSB program operation so that the threshold voltages of the memory cells coupled to the $(n+1)^{th}$ word line are higher than the third target voltages.

7. The method of claim 6, further comprising:

performing a LSB program operation on the memory cells coupled to the $(n-1)^{th}$ word line; and performing the LSB program operation on the memory cells coupled to the $n^{th}$ word line, before performing the first MSB program operation.

8. The method of claim 6, further comprising performing the LSB program operation on the memory cells coupled to the $(n+1)^{th}$ word line between the first MSB program operation and the second MSB program operation.

9. The method of claim 6, wherein the first to fifth MSB program operations are performed using an incremental step pulse program (ISPP) method of gradually raising a program voltage.

10. The method of claim 6, wherein a step voltage used in the third MSB program operation is set to be lower than a step voltage used in the first MSB program operation.

11. The method of claim 6, wherein a step voltage used in the fifth MSB program operation is set to be lower than a step voltage used in the second MSB program operation.

12. The method of claim 6, wherein a step voltage used in the sixth MSB program operation is set to be lower than a step voltage used in the third MSB program operation.

* * * * *